United States Patent
Lee et al.

[11] Patent Number: 5,926,728
[45] Date of Patent: Jul. 20, 1999

[54] METHOD FOR FABRICATING TUNGSTEN POLYCIDE CONTACTS

[75] Inventors: Hsiang-Fan Lee, Hsin-Chu; Jhon-Jhy Liaw, Taipei; Yi-Miaw Lin, Taipei; Liang Szuma, Taipei, all of Taiwan

[73] Assignee: Taiwan Semiconductor Manufacturing Company, Ltd., Hsin-Chu, Taiwan

[21] Appl. No.: 08/838,388

[22] Filed: Apr. 8, 1997

Related U.S. Application Data

[51] Int. Cl.$^6$ .................. H01L 21/283; H01L 21/324
[52] U.S. Cl. .................. 438/586; 438/649; 438/655; 438/657; 438/663
[58] Field of Search .................. 438/233, 301, 438/303, 586, 618, 630, 649, 655, 657, 663, 669, 664

[56] References Cited

U.S. PATENT DOCUMENTS

| | | | |
|---|---|---|---|
| 4,774,201 | 9/1988 | Woo et al. | 437/41 |
| 5,306,951 | 4/1994 | Lee et al. | 257/755 |
| 5,422,311 | 6/1995 | Woo | 438/655 |
| 5,483,104 | 1/1996 | Godinho et al. | 257/758 |
| 5,510,296 | 4/1996 | Yen et al. | 437/200 |
| 5,547,892 | 8/1996 | Wuu et al. | 437/52 |
| 5,763,303 | 6/1998 | Liaw et al. | 438/210 |

OTHER PUBLICATIONS

Nobili, C., et al., "Rapid thermal anealing of WSix", Applied Surface Science, Nov. 1991, vol. 53, pp. 219–223.
Wolf et al. "Silicon Processing for the VLSI Era, vol. 1" Lattice Press, Sunset Beach, CA, 1986, p. 58.

*Primary Examiner*—T. N. Quach
*Attorney, Agent, or Firm*—George O. Saile; Stephen B. Ackerman

[57] ABSTRACT

A method for fabricating polycide contacts to semiconductor substrates, and more specifically for self-aligned contacts on substrates having field effect transistors (FETs) is achieved. After forming conventional FETs from a patterned first polysilicon layer provided with contact areas, an insulating layer is deposited. Self-aligned contact openings are etched in the insulating layer to the contact areas on the substrate, and a patterned polycide (second polysilicon/silicide) layer is used to form the electrical contacts and interconnections. However, in prior art when a photoresist mask and plasma etching are used to pattern a polycide layer, misalignment of the mask can result in notching in the sidewalls of the patterned second polysilicon layer resulting in contact damage and high leakage currents. The method of the present invention utilizes a critical pre-etch rapid thermal anneal (RTA) that essentially eliminates the notching during etching of these marginally misaligned contacts. This allows tighter design ground rules to be used without high leakage currents, thereby providing higher density integrated circuits with improved product yield.

19 Claims, 3 Drawing Sheets

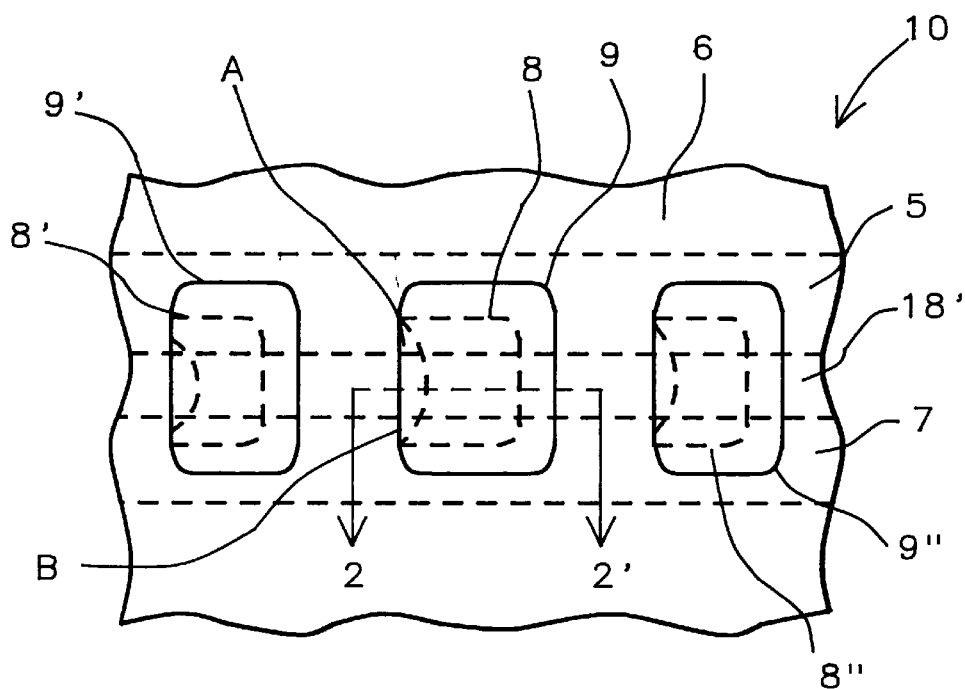
FIG. 1 – Prior Art
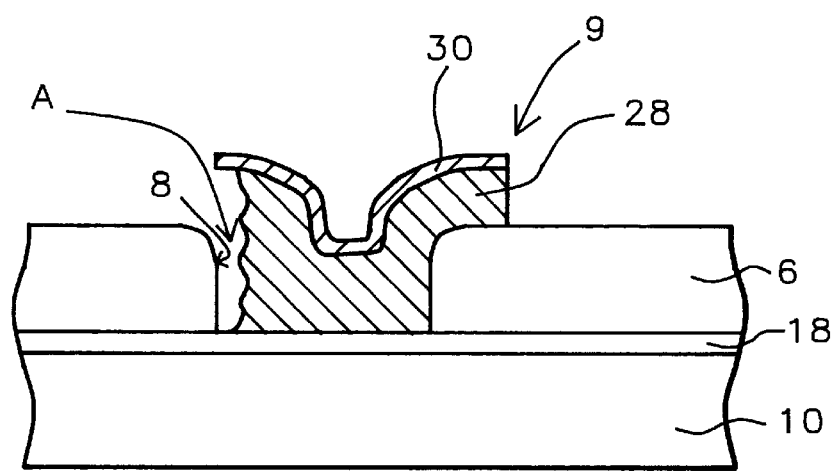
FIG. 2 – Prior Art

METHOD FOR FABRICATING TUNGSTEN POLYCIDE CONTACTS

BACKGROUND OF THE INVENTION

1. Field of the Invention

This invention relates to semiconductor integrated circuit devices, and more specifically to a novel method for forming polycide (polysilicon/tungsten silicide) contacts or interconnections, and more specifically a method for making self-aligned contacts to field effect transistors (FETs). This novel method eliminates polycide notching at the edges of contacts when the patterned polycide layer is misaligned over the contact openings which would otherwise cause high leakage current and low device yields.

2. Description of the Prior Art

The integrated circuit density on semiconductor substrates has dramatically increased in recent years. This increase in density is a result of downscaling of the individual devices built in and on the substrate, and the increase in line pitch (reduced line widths and spacing between lines) of the interconnecting electrically conducting lines that are used to wire up the devices. Future requirements for even greater device packing density are putting additional demands on the photolithographic resolution and anisotropic plasma etching techniques. Additional demand is also being placed on more aggressive design ground rules that can unfortunately result in misalignment of one patterned level over another underlying patterned level, such as metal lines over contact openings.

One processing area where this misalignment is of particular concern is the alignment of a patterned polycide (second polysilicon/silicide) layer over the self-aligned contacts to the substrate for FETs having gate electrodes made from a patterned first polycide or polysilicon layer. This is best understood with reference to a conventional prior art structure as shown in FIGS. 1 and 2. Shown in FIG. 1 is a schematic elevational view of two closely spaced FET gate electrodes, labeled 5 and 7, formed from a first polysilicon or polycide layer on a portion of a substrate 10. A self-aligned opening 8 is then etched in an interlevel dielectric insulating layer 6 over the gate electrodes. The contact opening 8 extends over the gate electrodes 5 and 7 thereby forming the self-aligned contact 9 in opening 8 which, in this specific application, serves as a common contact to the shallow junction (e.g., source/drain) contact areas 18 between the gate electrodes 5 and 7 of the FETs. A polycide (polysilicon/silicide) layer 9 is deposited and patterned using conventional photolithographic techniques and anisotropic plasma etching to form the electrical contact and/or next level of interconnections to the source/drain area 18 in the contact opening 8. However, because of the tight ground rules, misalignment can occur resulting in the edge B of patterned layer 9 being coincident with the edge of the contact opening 8. For example, this can occur on static random access memory (SRAM) having minimum feature sizes of 0.35 micrometers (um) and a misalignment of only 0.15 um. When this misalignment occurs the anisotropic plasma etching of layer 9 at the steep step in the contact opening 8 in layer 6 can result in enhanced lateral erosion or notching of the second poly-silicon layer, as depicted as region A in FIG. 1.

To better depict the nature of the notching problem, a schematic cross-sectional view through region 2—2' of FIG. 1 is shown in FIG. 2 for a conventional FET structure. Briefly, the gate electrodes 5 and 7 for the FET structures are formed by patterning a first polysilicon or polycide layer. Lightly doped source/drain regions are formed adjacent to the gate electrodes by ion implantation and then insulating sidewall spacers (not shown in FIG. 1) are formed on the sidewalls of the gate electrodes 5 and 7. A second ion implant is used to form the heavily doped shallow contact areas 18 to complete the FETs. Next an insulating layer 26 is deposited and typically planarized to form an interlevel dielectric layer (ILD) over the FETs. Now to achieve the device high packing density and improved circuit performance, self-aligned contact openings 8 are etched in layer 26 extending over the gate electrodes 5 and 7, as shown in FIG. 1. As shown in FIG. 2, a second polysilicon layer 28 having a silicide layer 30 is deposited and patterned by anisotropic etching to form the polycide contact 9 or the next level of electrical interconnections to the contact areas 18 on the substrate.

Also shown in FIG. 1 are two adjacent contact openings 8' and 8" having respective polycide contacts 9' and 9". It is desirable in the semiconductor industry to place the contacts as close as the photoresist resolution and alignment tolerances will allow to achieve the highest circuit density on the chip.

However, as more aggressive ground rules are used for patterning the polycide (polysilicon/silicide) layer 9, misalignment can result causing the edge of the patterned polycide layer 9 to be coincident with the edge of the contact opening 8, as shown in FIG. 1 and as depicted in the cross sectional view of FIG. 2. Unfortunately, during patterning, this results in notching or lateral erosion in the patterned second polysilicon layer 28 under the tungsten silicide layer 30, as depicted by the region A in FIGS. 1 and 2. This notching can result in plasma etch damage to the exposed portions of the shallow contact area 18 under the notch region A, resulting in higher leakage current between the contact 18 and substrate 10, leading to functional circuit failure, lower product yield, and reliability problems.

Several methods have been described in the prior art for improving contacts to the source/drain contact areas on FETs, but do not directly address the concerns cited above. For example, R. Lee et al., in U.S. Pat. No. 5,306,951, describe a method for making polysilicon structures, such as bit lines on memory devices in which a silicide is formed on the sidewalls to improve the conductivity. Another method is described by N. Godinho et al., in U.S. Pat. No. 5,483,104 in which a titanium silicide layer is formed on the gate electrode and the source/drain contacts, and a rapid thermal anneal is carried out in ammonia to convert the TiSi to a stable $TiSi_2$ phase and to form a titanium nitride on the surface. This serves as a protective etch stop over the source/drain contact areas when the second polysilicon layer is patterned to form the next level of interconnections (e.g., bit lines). A titanium silicide is then formed after the polysilicon is patterned. S-G Wuu et al., U.S. Pat. No. 5,547,892, teach a method for forming novel plug structures to a polysilicon layer for thin film transistors (TFT) on SRAM devices and concurrently to the substrate, but do not describe contacts to the FET self-aligned source/drain contact areas. H. Yen et al., U.S. Pat. No. 5,510,296, teach a method for making non-self-aligned contacts to source/drain contact areas in which a tungsten silicide ($WSi_2$) is formed on an amorphous polysilicon. The $WSi_2$/amorphous polysilicon is then etched and afterwards annealed to form the contact. B-J Woo et al., U.S. Pat. No. 4,774,201, provide a method for protecting the tungsten silicide from forming a rough surface on the gate electrode with a CVD oxide during a reoxidation. This reoxidation improves the gate oxide breakdown voltage at the edge of the gate electrode. Woo et al. do not address the formation of self-aligned source/drain contacts to the FETs.

Therefore, there is still a need in the semi-conductor industry to provide a method for etching polycide contacts or interconnections over contact openings to shallow junction contact regions on the substrate, and more particularly for etching self-aligned contacts to contact areas of FETs while eliminating or minimizing the notching.

SUMMARY OF THE INVENTION

It is an object of this invention to provide an optimized process for making polycide contact structures to shallow p/n junctions on semiconductor substrates that eliminates the notching and thereby minimizes leakage current and improves product yields.

It is another object of the present invention to utilize a pre-etch rapid thermal anneal prior to patterning the polycide contact to eliminate the notching when the edge of the patterned polycide contact is coincident with the edge of the contact opening in the interlevel dielectric layer.

It is still another object of the invention to fabricate these improved polycide contact structures using a cost effective manufacturing process.

In accordance with the present invention, a method is described for forming patterned polycide contacts to the shallow diffused junctions on semiconductor substrates, and more specifically to the contacts on FETs. The method employs a thermal anneal prior to etching the polycide which eliminates or significantly reduces the notching that would otherwise occur at the edge of the polycide contacts when misaligned over the contact openings that are etched in the insulating layer over the semiconductor substrate. The method of this invention allows for tighter design ground rules to be used, leading to higher circuit density. Although the method is described for making polycide contacts for FETs, it should be well understood by those skilled in the art that the method generally applies to the fabrication of self-aligned polycide contacts to semi-conductor substrates and to either P or N conductively doped contacts.

Prior to forming the self-aligned contacts to the substrate, FETs are formed first on the substrate. The method begins by providing a semiconductor substrate, such as a P doped single crystal silicon substrate having device areas. The FETs are formed by first growing a thin gate oxide on the device areas, and then depositing a first polysilicon layer or a polycide layer on which is deposited a cap insulating layer, such as silicon oxide or a multilayer of silicon oxide/silicon nitride. The stacked layer is then patterned by photoresist masking and anisotropic plasma etching to form the FET gate electrodes and local interconnections elsewhere on the substrate. Lightly Doped source/Drain (LDD) areas are made, typically by ion implantation, in the device areas adjacent to the gate electrodes, and a conformal sidewall spacer insulating layer is deposited and anisotropically etched back to form sidewall spacers on the gate electrodes. Heavily doped source/drain contact areas are formed next, also by ion implantation, adjacent to the sidewall spacers to complete the FETS. An insulating layer (interlevel dielectric or ILD layer) is then deposited over the FETs and elsewhere on the substrate to electrically insulate the partially completed integrated circuits from the next level of interconnections. Conventional photolithographic techniques and anisotropic plasma etching are used to etch contact openings (holes) in the insulating layer (ILD) to the contact areas on the substrate, such as to the desired FET source/drain contact areas. Typically the contact openings are etched to contact areas on the substrate and extend over the patterned first polysilicon layer that also serves as the FET gate electrodes and thereby forming self-aligned contact (SAC) openings. The next level of interconnections or contacts are formed by depositing a conformal second polysilicon layer on the insulating layer and into the contact openings making electrical contact to the self-aligned contact areas. The second polysilicon layer is conductively doped by ion implantation or by in situ doping during the polysilicon deposition to form the ohmic contact to the substrate. A tungsten silicide ($WSi_2$) layer is then deposited on the second polysilicon layer to form the polycide layer.

Now, an important feature of this invention, prior to patterning the polycide layer a pre-etch anneal is carried out to improve the etching characteristics and thereby eliminate or minimize the lateral etching, and prevent the notching that would otherwise occur at the misaligned contacts. For example, the annealing can be achieved by using a Rapid Thermal Anneal (RTA). A photo-resist masking and anisotropic plasma etching are then used to pattern the polycide layer leaving portions over the contact openings to form the contacts and interconnections.

BRIEF DESCRIPTION OF THE DRAWINGS

The objects and advantages of this invention are best understood by the preferred embodiment with reference to the attached drawings which are now briefly described.

FIG. 1 is a prior art schematic elevational view of polycide contacts to self-aligned source/drain contacts depicting the notching of the misaligned patterned polycide layer at the edge of the source/drain contact openings.

FIG. 2 is a prior art schematic cross-sectional view through 2—2' of FIG. 1 depicting the notching of the patterned polysilicon layer under the silicide layer that can occur when the photoresist mask for etching the polycide contact is misaligned.

DESCRIPTION OF THE PREFERRED EMBODIMENT

Figure 3:
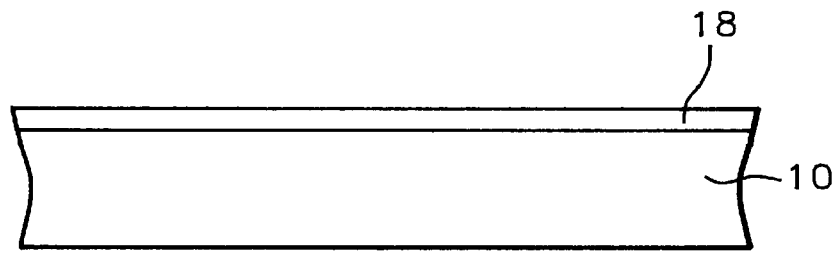
FIGS. 3 through 6 are schematic cross-sectional views through region 2—2' of FIG. 1 showing the sequence of processing steps for forming the self-aligned polycide contacts to the substrate by the method of this invention, which eliminates the notching.

The method of fabricating these improved self-aligned polycide (polysilicon/silicide) contacts or electrical interconnections to shallow diffused junctions on the substrate, such as bit line contacts for SRAM FETs, is described in detail. The polycide contact process employs a pre-polycide-etch anneal. This annealing eliminates the notching (lateral erosion) in the underlying polysilicon of the polycide layer when the photoresist etch mask is misaligned for etching the polycide contacts over the contact openings in an insulating layer to the shallow diffused junction contact areas on the substrate. Although the method is described for $N^+$ doped self-aligned contacts for N-channel FETs, it should also be understood that the method equally applies to P-channel FETs and to substrates having both P and N doped wells on which both N- and P-channel FETs can be concurrently made for fabricating CMOS circuits. The method is specifically applicable to bit line contacts on static random access memory (SRAM) having minimum feature sizes of 0.35 micrometers (um), and applies in general to electrical contacts etched on the semi-conductor substrate.

To put the invention for making these contacts in better perspective, the method of fabricating the FETs, such as 5 and 7 in FIG. 1, having a common contact area 18 is briefly described. The sequence of processing steps for making the N-channel FETs is similar to the prior art. Typically substrate 10 on which the FETs are formed is composed of a P-type single crystal silicon having a <100> crystallographic orientation. The device areas on the substrate are usually surrounded by field oxide regions to electrically isolate the device regions, but are not depicted in the figures to simplify the drawings and the discussion. After the field oxide is formed, the device areas are appropriately cleaned and a thin gate oxide is grown on substrate 10 for the FETs. The gate oxide is formed by subjecting the substrate 10 to an oxidizing ambient at elevated temperatures, such as dry oxygen at about 750 to 850° C., to form a thermal oxide. The preferred thickness of the oxide layer is between about 65 and 75 Angstroms. The FET gate electrodes (depicted in FIG. 1 by 5 and 7) are made by depositing a first polysilicon layer, for example, by low pressure chemical deposition (LPCVD) using a reactant gas such as silane ($SiH_4$) The preferred thickness of the first polysilicon layer is between about 900 and 1100 Angstroms. The polysilicon layer is then doped by ion implantation using phosphorus ($P^{31}$) or arsenic ($As^{75}$) ions or alternatively, by in-situ doping of the polysilicon during the low pressure chemical vapor deposition and is doped to a concentration of between about 1.0 E 20 and 1.0 E 21 atoms/$cm^3$. Alternatively, the first polysilicon layer can have deposited on its surface a silicide layer to form a polycide layer with improved electrical conductivity, but, for the sake of this invention, can be either type. For example, the polycide can be formed by depositing a tungsten silicide ($WSi_2$) layer having a thickness of between about 900 and 1100 Angstroms. Continuing with the process, conventional photolithographic techniques and anisotropic plasma etching are used to pattern the polysilicon layer to form the gate electrodes 5 and 7 of FIG. 1. Lightly doped source/drain areas are formed next adjacent to the gate electrodes by implanting an N-type dopant species, such as arsenic ions ($As^{75}$) or phosphorus ions ($P^{31}$) For example, a typical implant might consist of phosphorus $P^{31}$ at a dose of between about 1.0 E 12 and 1.0 E 14 atoms/$cm^2$, and more specifically an implant dose of 1.0 E 13 ions/$cm^2$. The ion implant energy is between about 30 and 80 KeV. Sidewall spacers, not depicted in FIG. 1, are then formed on the sidewalls of the gate electrodes 5 and 7. The sidewall spacers are formed by depositing a conformal sidewall insulating layer and then anisotropically etching back the insulating layer to the silicon surface 10. For example, the insulating layer can be a silicon oxide formed by low pressure chemical vapor deposition (LPCVD) using a reactant gas such as tetraethosiloxane (TEOS) at a temperature in the range of between about 650 and 750° C. The etch back can be performed in a plasma etcher at low pressure, such as by reactive ion etching (RIE) using an etchant gas of trifluoromethane ($CHF_3$) The $N^+$ source/drain contact areas 18 are now formed adjacent to the sidewall spacers by using a second ion implantation to complete the FETs. Typically, after further thermal processing, the final n/p junction depth of the FET source/drain contacts can be quite shallow, and can be easily damaged during further processing resulting in high leakage currents between the source/drain contact 18 and substrate 10. For example, as shown in FIG. 2, this is a particular concern when the polycide contact 9 patterned from the second polysilicon layer 28 and the silicide layer 30 are misaligned to the contact openings 8 in the insulating layer 26 during patterning by conventional photolithographic techniques and anisotropic plasma etching.

Referring now to FIGS. 3 through 6, the sequence of process steps, by this invention, are shown for making the polycide contacts without notching when the polycide contacts are misaligned to the FET contact openings in the insulating layer. More specifically FIGS. 3 through 6 show the sequence of schematic cross-sectional views through the region 2—2' of FIG. 1 for a shallow diffused junction contact area 18 common to two adjacent field effect transistors (FETS) 5 and 7 having the misaligned polycide contacts.

Referring first to FIG. 3, the schematic cross-sectional view is shown through region 2—2' of FIG. 1 along one of the common contact openings 8 to the shallow diffused contact area 18 after forming the FETs from the patterned first polysilicon layer. The cross section 2—2' does not depict the first polysilicon layer from which the FETs are formed.

Figure 4:
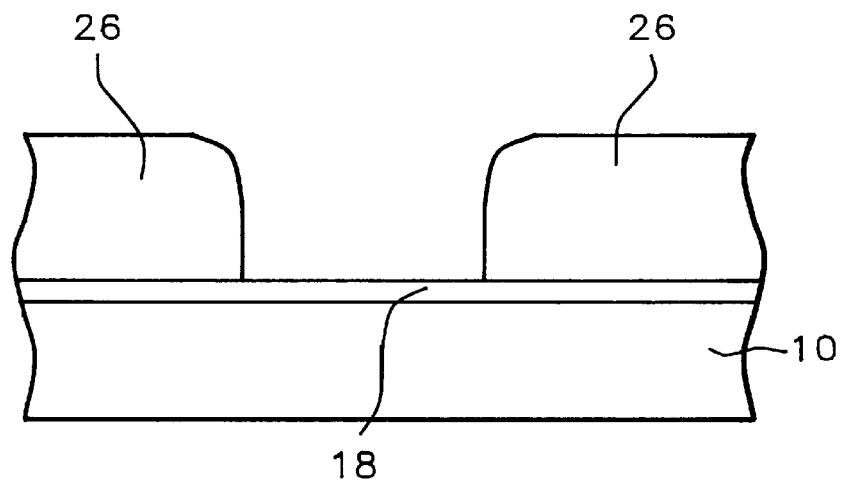

Referring now to FIG. 4, an insulating layer 26 is deposited over the FETs to form the interlevel dielectric layer (ILD) that insulates the patterned first polysilicon layer (5 and 7 in FIG. 1) on substrate 10 from the next level of interconnections. Layer 26 is preferably composed of a silicon oxide and is deposited by plasma enhanced chemical vapor deposition (PECVD) using, for example, TEOS, and is deposited at a temperature of between about 300 and 500° C. The preferred thickness of layer 26 is between about 2000 and 4000 Angstroms.

Still referring to FIG. 4, conventional photo-lithographic techniques and anisotropic plasma etching are used to form contact openings 8 in layer 26 to the required shallow diffused junction contact areas, such as area 18. For example, the plasma etching can be performed in a high density plasma etcher using an etchant gas containing $CHF_3$ or carbon tetrafluoride ($CF_4$) and hydrogen ($H_2$). The contact opening 8 also extends over the gate electrodes 5 and 7 and is etched thereby forming the self-aligning contact opening to the patterned first polysilicon layer.

Figure 5:
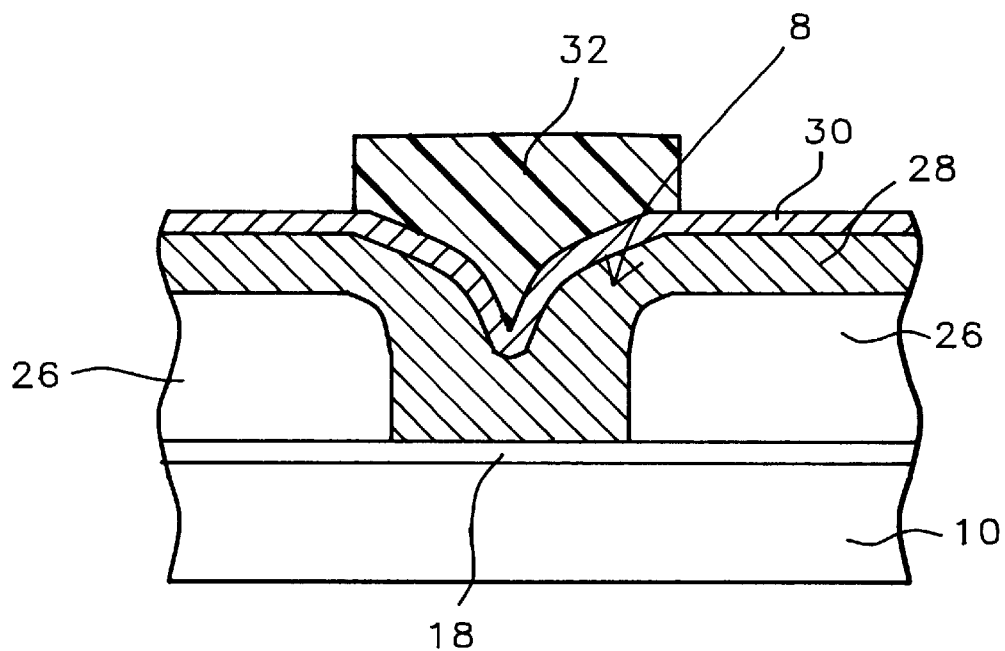
Figure 6:
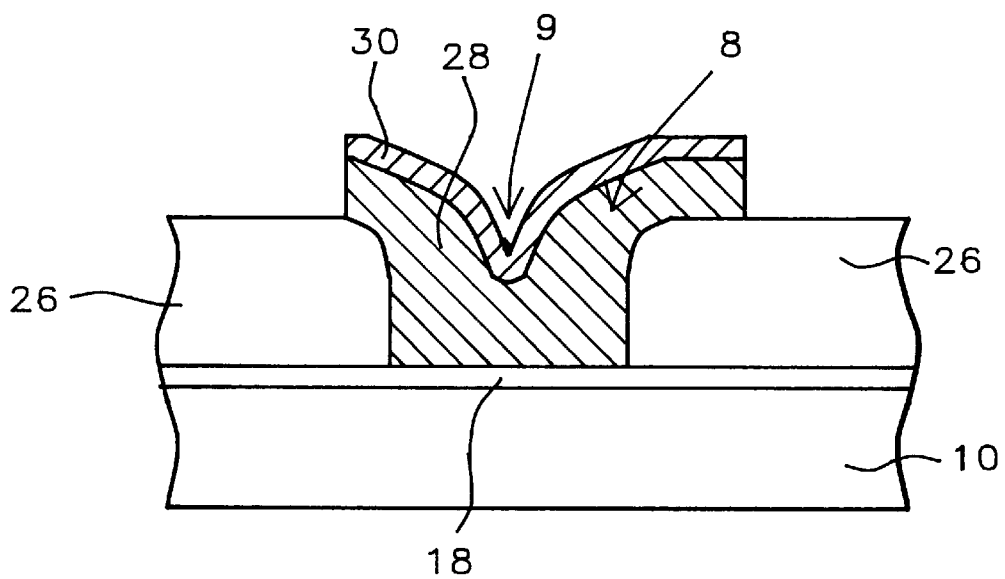

Relating now more specifically to the method of this invention and to FIGS. 5 and 6, a method is described in detail for forming the polycide contact 9 of FIG. 1 without the notching that would occur in the prior art method as depicted in FIG. 2 as region A. The patterned polycide layer serves as both the contact metallurgy and portions of the electrical interconnections, such as for the bit lines on SRAM.

Now as shown in FIG. 5, any native oxide that may have formed in the contact opening 8 on the contact area 18 is removed in a dilute solution of hydrofluoric (DHF) acid, and a conformal second polysilicon layer 28 is deposited over the insulating layer 26 and also in the contact openings, such as contact opening 8. Preferably the second polysilicon layer 28 is deposited by LPCVD using a reactant gas such as silane ($SiH_4$) in a temperature range of between about 560 and 580° C. The preferred thickness of layer 28 is between about 900 and 1100 Angstroms. Layer 28 is preferably doped in situ during LPCVD by adding a dopant gas, such as arsine ($AsH_3$) or phosphine (P). The deposition parameters are selected to provide a final dopant concentration to form a low resistance ohmic contact to the shallow diffused junction contact areas 18, and more specifically has a dopant concentration of between about 1.0 E 20 and 1.0 E 21 atoms/$cm^3$. During subsequent annealing of the substrate the implanted atomic species (As or P) is activated to form the ohmic contacts to the junction contact areas 18 in substrate 10.

Still referring to FIG. 5, a tungsten silicide ($WSi_2$) layer 30 is deposited on the second polysilicon layer 28, thereby forming a tungsten polycide layer composed of layers 28 and 30. The preferred method of depositing the $WSi_2$ is by LPCVD using a reactant gas mixture of $SiCl_2H_2$ and tungsten hexafluoride ($WF_6$) at a temperature of between about 540 and 560° C. The preferred thickness of the silicide layer 30 is between about 900 and 1100 Angstroms.

A critical step in the present invention is a pre-etch anneal which is now carried out prior to patterning the tungsten polycide layer (layers 28 and 30). Preferably the pre-etch anneal is performed using a rapid thermal anneal (RTA), and is performed at a temperature of between about 720 and 880° C. for a time of between about 25 and 35 seconds. More specifically, the RTA is performed at a temperature of 800° C. for about 30 seconds. The RTA is preferably performed in an ambient gas, such as nitrogen ($N_2$) or Argon (Ar). The RTA prevents notching of the polysilicon layer 28 underneath the tungsten silicide layer 30 when layers 30 and 28 are etched using a misaligned photoresist mask. By way of example, the RTA prevents notching when layer 30 is etched using a photoresist mask that is misaligned by as much as 0.12 micrometer (um) on products such as SRAM having a minimum feature size of 0.35 um, such as when forming SRAM bit line contacts.

Still referring to FIG. 5, photolithographic techniques and anisotropic plasma etching are used to pattern the tungsten polycide layer (layers 28 and 30), over the self-aligned contact openings 8. However, exemplifying the advantages of the pre-anneal step the photoresist image 32 in FIG. 5 is shown deliberately shifted a distance D to the right to demonstrate the etching characteristics of the tungsten polycide layer (layer 9 in FIG. 1) when the pre-etch anneal (RTA) of this invention is carried out, for example, when the misalignment is about 0.10 um for a 0.35 um minimum feature size.

Now as shown in FIG. 6, the polycide self-aligned contact 9 is patterned over the contact opening 8. The preferred etching is an anisotropic plasma etch carried out using a high density plasma etch or, alternatively, using reactive ion etching (RIE), and an etchant gas having a high etch selectivity to the underlying CVD silicon oxide layer 26. For example, the etching can be carried out using an etchant gas containing chlorine ions.

However, as shown in FIG. 6 for the misaligned photoresist mask along the horizontal direction 2—2' in FIG. 1 of the prior art, the notching or erosion at the sidewall of the second polysilicon layer 28 of the prior art (FIG. 2) is not present when the tungsten polycide layer (layers 28 and 30) is first rapid thermally annealed (RTA) prior to the plasma etching, by the method of this invention. This allows for tighter ground rules to be used during mask design, thereby increasing the circuit density on the semiconductor chip without resulting in plasma etch damage at the shallow diffused junction contact 18 in region A (FIG. 2) of the prior art.

While the invention has been particularly shown and described with reference to the preferred embodiment thereof, it will be understood by those skilled in the art that various changes in form and details may be made without departing from the spirit and scope of the invention. Therefore, it should be well understood that these improved polycide contacts without notching can in general be made to other contact areas on the substrate.

What is claimed is:

1. A method for fabricating tungsten polycide contacts over and in contact openings to a semiconductor substrate for integrated circuits, comprising the steps of:

providing said semiconductor substrate having device areas;

depositing a first polysilicon layer on said substrate;

patterning said first polysilicon layer and forming portions of semiconductor devices on said device areas;

depositing an insulating layer over said patterned first polysilicon layer, and elsewhere on said device areas;

photoresist masking and anisotropically plasma etching said contact openings in said insulating layer to said device areas adjacent to said semiconductor devices;

depositing a second polysilicon layer in and over said contact openings and elsewhere on said insulating layer;

depositing a tungsten silicide layer, by low-pressure chemical vapor deposition using a reactant gas of tungsten hexafluoride and dichlorosilane, on said second polysilicon layer, and forming a polycide layer;

annealing said polycide layer on said substrate by rapid thermal anneal at a temperature of between 720 and 880° C. for 25 to 35 seconds;

patterning said polycide layer by photoresist masking and anisotropic plasma etching leaving portions of said polycide layer over said contact openings, and furthermore said annealing preventing notching in sidewalls of said second polysilicon layer where said sidewalls are aligned over edges of said contact openings.

2. The method of claim 1, wherein said first polysilicon layer is heavily doped with a conductive dopant having a concentration of between about $1.0\times10^{19}$ and $1.0\times10^{21}$ atoms/cm$^3$.

3. The method of claim 1, wherein first polysilicon layer has a thickness of between about 1500 and 2000 Angstroms.

4. The method of claim 1, wherein said patterned first polysilicon layer forms gate electrodes for field effect transistors, and further, sidewalls of said patterned first polysilicon layer have insulating sidewall spacers.

5. The method of claim 1, wherein said insulating layer is a silicon oxide deposited by plasma enhanced chemical vapor deposition and has a thickness of between about 2000 and 4000 Angstroms.

6. The method of claim 1, wherein said contact openings extend over said patterned first polysilicon layer, thereby forming self-aligned contact openings.

7. The method of claim 1, wherein said second polysilicon layer is deposited by low pressure chemical vapor deposition using a reactant gas of silane.

8. The method of claim 1, wherein said second polysilicon layer has a thickness of between about 900 and 1100 Angstroms.

9. The method of claim 1, wherein said second polysilicon layer is heavily doped with a conductive dopant having a concentration of between about $1.0\times10^{20}$ and $1.0\times10^{21}$ atoms/cm$^3$.

10. The method of claim 1, wherein said patterning of said polycide layer is carried out in a reactive ion etcher using an etch gas mixture containing chlorine ions.

11. A novel method for fabricating tungsten polycide contacts over and in self-aligned contact openings of field effect transistors for integrated circuits, comprising the steps of:

providing a semiconductor substrate having device areas;

depositing a first polysilicon layer on said substrate;

patterning said first polysilicon layer and thereby forming gate electrodes for said field effect transistors on said device areas;

depositing a conformal sidewall spacer insulating layer, and anisotropically etching back to form sidewall spacers on said gate electrodes;

depositing an insulating layer over said patterned first polysilicon layer, and elsewhere on said device areas;

photoresist masking and anisotropically plasma etching contact openings in said insulating layer to said device areas adjacent to and extending over said gate electrodes, thereby forming said self-aligned contact openings;

depositing a second polysilicon layer in and over said self-aligned contact openings and elsewhere on said insulating layer;

depositing a tungsten silicide layer on said second polysilicon layer, and forming a polycide layer;

annealing said polycide layer on said substrate by rapid thermal anneal at a temperature of between about 720 and 880° C. for a time of between about 25 and 35 seconds;

patterning said polycide layer by photoresist masking and anisotropic plasma etching leaving portions of said polycide layer over said self-aligned contact openings, and furthermore said annealing preventing notching in sidewalls of said second polysilicon layer where said sidewalls are aligned over edges of said self-aligned contact openings.

12. The method of claim 11, wherein said first polysilicon layer is heavily doped with a conductive dopant having a concentration of between about $1.0 \times 10^{19}$ and $1.0 \times 10^{21}$ atoms/cm$^3$.

13. The method of claim 11 wherein said first polysilicon layer has a thickness of between about 1500 and 2000 Angstroms.

14. The method of claim 11, wherein said insulating layer is composed of silicon oxide and is deposited by plasma enhanced chemical vapor deposition to a thickness of between about 2000 and 4000 Angstroms.

15. The method of claim 11, wherein said second polysilicon layer is deposited by chemical vapor deposition using a reactant gas of silane.

16. The method of claim 11, wherein said second polysilicon layer has a thickness of between about 900 and 1100 Angstroms.

17. The method of claim 11, wherein said second polysilicon layer is heavily doped with a conductive dopant having a concentration of between about $1.0 \times 10^{20}$ and $1.0 \times 10^{21}$ atoms/cm$^3$.

18. The method of claim 11, wherein said tungsten silicide layer is deposited by low pressure chemical vapor deposition using a reactant gas of tungsten hexafluoride and dichlorosilane.

19. The method of claim 11, wherein said patterning of said polycide layer is carried out in a reactive ion etcher using an etch gas mixture containing chlorine ions.

* * * * *